(12) United States Patent
Puggelli et al.

(10) Patent No.: US 11,296,597 B1
(45) Date of Patent: Apr. 5, 2022

(54) SWITCHED-CAPACITOR REGULATORS WITH OUTPUT TRANSIENT COMPENSATION

(71) Applicant: Apple Inc., Cupertino, CA (US)

(72) Inventors: Alberto Alessandro Angelo Puggelli, Cupertino, CA (US); Ahmed M. Sawaby, Stanford, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/033,597

(22) Filed: Sep. 25, 2020

(51) Int. Cl.
| | |
|---|---|
| *G05F 1/10* | (2006.01) |
| *G05F 3/02* | (2006.01) |
| *H02M 3/07* | (2006.01) |
| *G01R 19/165* | (2006.01) |
| *G11C 5/14* | (2006.01) |
| *H02M 1/00* | (2006.01) |

(52) U.S. Cl.
CPC ........ *H02M 3/07* (2013.01); *G01R 19/16538* (2013.01); *G11C 5/145* (2013.01); *H02M 1/0012* (2021.05); *H02M 1/0025* (2021.05)

(58) Field of Classification Search
CPC .. H02M 3/073; H02M 3/07; H02M 2003/077; G11C 5/145; G05F 3/205
USPC ...................................... 327/536; 363/59–60
See application file for complete search history.

(56) References Cited

U.S. PATENT DOCUMENTS

| | | | | |
|---|---|---|---|---|
| 6,255,896 B1* | 7/2001 | Li | ................. | H02M 3/073 327/536 |
| 6,707,280 B1* | 3/2004 | Liu | ................. | G05F 1/618 323/224 |
| 7,345,530 B1 | 3/2008 | Li et al. | | |
| 8,542,059 B2 | 9/2013 | Tejada et al. | | |
| 9,621,034 B2* | 4/2017 | Liu | .................. | H03K 7/06 |
| 10,234,888 B2* | 3/2019 | Kim | .................. | G05F 3/08 |
| 10,574,229 B1 | 2/2020 | Nandi | | |
| 2007/0097719 A1* | 5/2007 | Parramon | ............. | A61N 1/378 363/72 |
| 2009/0072800 A1* | 3/2009 | Ramadass | ........... | H02M 3/1584 323/271 |
| 2009/0219081 A1* | 9/2009 | Kwon | ................ | G11C 5/145 327/536 |
| 2011/0050325 A1* | 3/2011 | Schatzberger | ........ | H02M 3/073 327/536 |
| 2011/0128070 A1* | 6/2011 | Pagano | ............... | H03K 5/2481 327/536 |
| 2011/0128762 A1* | 6/2011 | Ripley | .................. | H02M 3/158 363/62 |

(Continued)

*Primary Examiner* — Quan Tra
(74) *Attorney, Agent, or Firm* — Kowert, Hood, Munyon, Rankin & Goetzel, P.C.

(57) ABSTRACT

A power converter circuit included in a computer system includes a switched-capacitor circuit as well as one or more bypass devices, and generates a particular voltage on a regulated power supply node. In response to situations that can result in a rapid transient of the voltage level on the regulated power supply node (e.g., upscaling or downscaling), the power converter circuit may activate the bypass devices to source or sink current from the regulated power supply node. By employing both the switched-capacitor circuit and the bypass devices, the power converter may be able to more rapidly adjust the voltage level of the regulated output supply node, as well as maintain voltage across the devices and capacitors included in the switched-capacitor circuit within specified tolerances.

19 Claims, 15 Drawing Sheets

(56) References Cited

U.S. PATENT DOCUMENTS

| | | | |
|---|---|---|---|
| 2011/0156803 A1* | 6/2011 | Yap | H02M 3/073 327/536 |
| 2011/0285375 A1* | 11/2011 | Deboy | G05F 1/67 323/299 |
| 2014/0285171 A1* | 9/2014 | Katsumata | H02M 3/07 323/284 |
| 2017/0244318 A1* | 8/2017 | Giuliano | H02M 3/1582 |

* cited by examiner

US 11,296,597 B1

SWITCHED-CAPACITOR REGULATORS WITH OUTPUT TRANSIENT COMPENSATION

BACKGROUND

Technical Field

Embodiments described herein relate to integrated circuits, and more particularly, to techniques for generating regulated power supply voltages.

Description of the Related Art

Modern computer systems may include multiple circuit blocks designed to perform various functions. For example, such circuit blocks may include processors, processor cores configured to execute software or program instructions. Additionally, the circuit blocks may include memory circuits, mixed-signal or analog circuits, and the like.

In some computer systems, the circuit blocks may be designed to operate at different power supply voltage levels. Power management circuits may be included in such computer systems to generate and monitor varying power supply voltage levels for the different circuit blocks.

Power management circuits often include one or more power converter circuits configured to generate regulator voltage levels on respective power supply signals using a voltage level of an input power supply signal. Such regulator circuits may employ multiple passive circuit elements, such as inductors, capacitors, and the like.

SUMMARY OF THE EMBODIMENTS

Various embodiments for generating a regulated power supply voltage level are disclosed. Broadly speaking, a power converter circuit includes a switched-capacitor circuit that includes a plurality of switches and a plurality of capacitors. The switched-capacitor circuit is configured, in response to an activation of a pre-charge mode, to couple the plurality of capacitors between the regulated power supply node and a ground supply node. The switched-capacitor circuit is also configured to generate a particular voltage level on a regulated power supply node using a reference voltage. The power converter circuit also includes a bypass device coupled between the input power supply and the regulated power supply node. The bypass device is configured to source a bypass current to the regulated power supply node when activated. A control circuit is configured, in response to receiving a startup request, to activate the bypass device. In response to a determination that a voltage level of the regulated power supply node has reached a pre-charge level, the control circuit is further configured to de-activate the bypass device. By using the bypass device in conjunction with the switched-capacitor circuit, the power converter circuit may be able, upon startup, to reduce a time needed to achieve regulation of the voltage level on the regulated power supply node, as well as keep voltage levels across the plurality of capacitors in the switched-capacitor circuit below a maximum rated voltage for the plurality of capacitors.

BRIEF DESCRIPTION OF THE DRAWINGS

The following detailed description makes reference to the accompanying drawings, which are now briefly described.

DETAILED DESCRIPTION OF EMBODIMENTS

Computer systems may include multiple circuit blocks configured to perform specific functions. Such circuit blocks may be fabricated on a common substrate and may employ different power supply voltage levels. Power management units (commonly referred to as "PMUs") may include multiple power converter circuits configured to generate regulated voltage levels for various power supply signals. Such power converter circuits may employ regulator circuits that include both passive circuit elements (e.g., inductors, capacitors, etc.) as well as active circuit elements (e.g., transistors, diodes, etc.).

Different types of voltage regulator circuits may be employed based on power requirements of load circuits, available circuit area, and the like. One type of commonly used voltage regulator circuit is a switched-capacitor circuit. Such converter circuits include multiple capacitors and switches, which are used to couple different ones of the capacitors between a regulated power supply node and either an input power supply node or a ground supply node at different times to generate a desired voltage level on the regulated power supply node.

To manage power and performance, a computer system can employ dynamic voltage scaling to adjust the voltage level of power supply nodes to specific circuits within the computer system. When a circuit is not being heavily used, the voltage level of its power supply node may be reduced (in a process referred to as "downscaling") to reduce power dissipation. The voltage level of the power supply node is then increased (in a process referred to as "upscaling") to an operational level when use of the circuit increases. In some cases, the voltage level of a power supply node is set to ground (referred to as "shutdown") to be later reset to an operational level (referred to as "startup").

Such upscaling and downscaling operations are difficult in computer systems with power converter circuits that are external to the circuits to which they are supplying power. Wiring and package parasitic circuits elements can limit the bandwidth with which a power converter can adjust its output voltage level, preventing the use of fine time-scale power management techniques. Additionally, during voltage scaling, voltage levels across devices and capacitors in a power converter circuit can exceed maximum ratings, possibly damaging or degrading the devices and capacitors. Methods and circuits described in the present disclosure may provide for techniques for operating a power converter circuit, which includes a switched-capacitor circuit and bypass devices, to improve response to requests for changes in an output voltage of the power converter circuit, as well as protect devices and capacitors in the switched-capacitor circuit from over-voltage situations.

Figure 1:
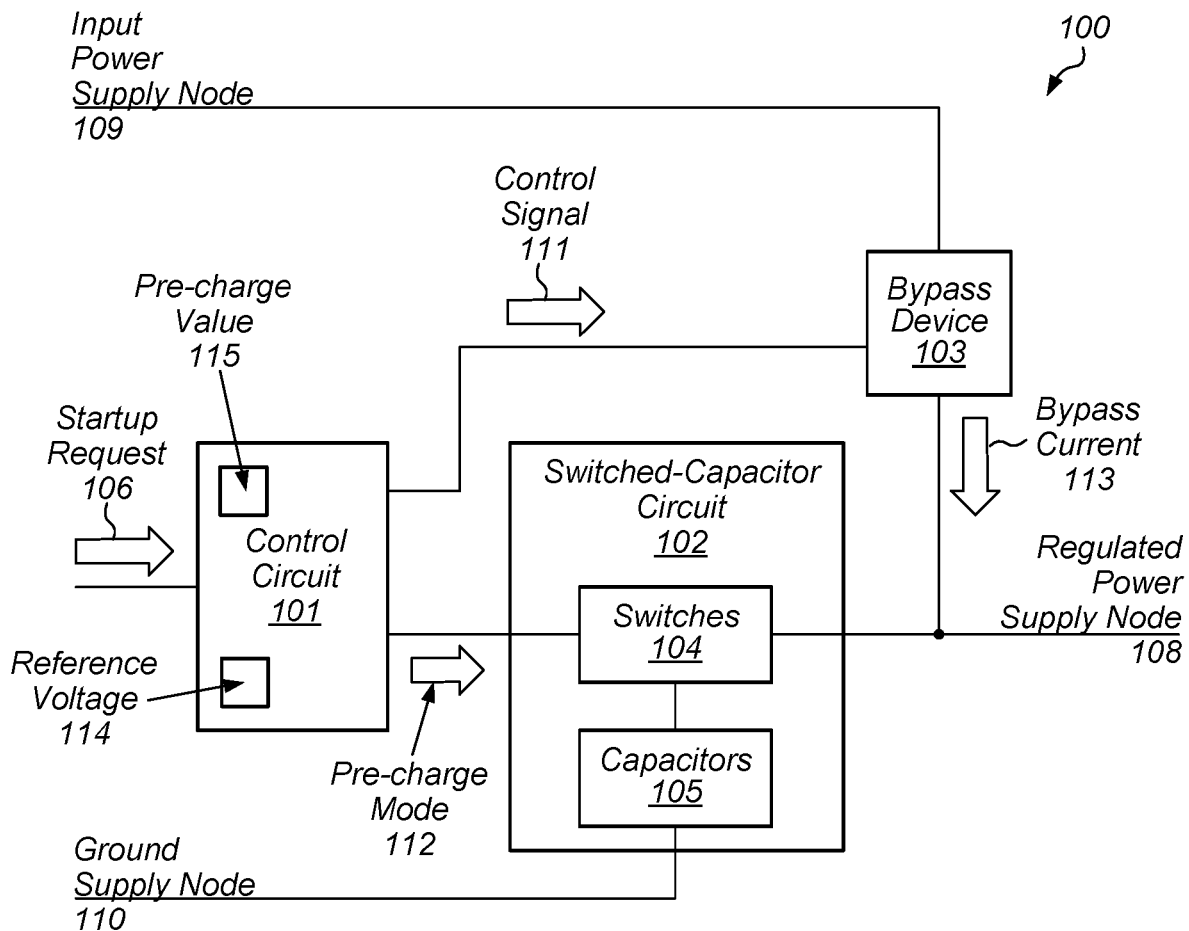
FIG. 1 is a block diagram of an embodiment of a switched-capacitor regulator circuit.

Turning to FIG. 1, a block diagram of an embodiment of a power converter circuit is depicted. As illustrated, power converter circuit 100 includes control circuit 101, bypass device 103, and switched-capacitor circuit 102, which includes switches 104 and capacitors 105.

Switched-capacitor circuit 102 includes switches 104 and capacitors 105, and is configured, in response to an activation of pre-charge mode 112, to couple the capacitors 105 between regulated power supply node 108 and ground supply node 110. Switched-capacitor circuit 102 is further configured to generate a particular voltage level on regulated power supply node 108 using reference voltage 114.

As described below in more detail, to generate the particular voltage level on regulated power supply node 108, switched-capacitor circuit 102 may be further configured to close a first subset of switches 104 for a given time period. After the given time period has elapsed, switched-capacitor circuit 102 may be further configured to open the first subset of switches 104 and close a second subset of switches 104. By opening and closing switches 104, switched-capacitor circuit 102 charges particular ones of capacitors 105, which are then coupled to regulated power supply node 108 to maintain the particular voltage level.

Bypass device 103 is coupled between input power supply node 109 and regulated power supply node 108. In various embodiments, bypass device 103 is configured to source bypass current 113 to regulated power supply node 108. Bypass device 103 may, in some embodiments, be implemented as one or more p-channel metal-oxide semiconductor field-effect transistors (MOSFETs) or any other suitable transconductance devices.

Control circuit 101 is configured, in response to receiving startup request 106, to activate bypass device 103 and pre-charge mode 112. In some cases, control circuit 101 is also configured, in response to a determination that the voltage level of regulated power supply node 108 is greater than pre-charge value 115, to deactivate bypass device 103. In various embodiments, pre-charge value 115 is less than reference voltage 114.

As described below, control circuit 101 is also configured to activate bypass device 103 during upscaling operations, in which reference voltage 114 transitions from a current value to a new higher value. Rather than letting switched-capacitor circuit 102 adjust the voltage level of regulated power supply node 108 to the new value, bypass device 103 can be activated to source bypass current 113 to regulated power supply node 108. As with the startup case, bypass device 103 may be active until the voltage level of regulated power supply node is within a threshold value of its new value. Once the voltage level is within the threshold value, bypass device 103 is de-activated and switched-capacitor circuit 102 may take over and fine-tune the voltage level of regulated power supply node 108 to its new level. The use of bypass device 103 in conjunction with switched-capacitor circuit 102 allows more rapid changes of the voltage level of regulated power supply node 108, improving the effectiveness of dynamic voltage scaling within a computer system.

By pre-charging capacitors 105 and using bypass device 103 to quickly bring the voltage level of regulated power supply node 108 to a value near a desired level, power converter circuit 100 is able to keep respective voltage level across capacitors 105 below a maximum rating for capacitors 105. Keeping the respective voltage levels across capacitors 105 below the maximum rating may prevent damage to capacitors 105 and may extend the operational life of capacitors 105.

Figure 2:
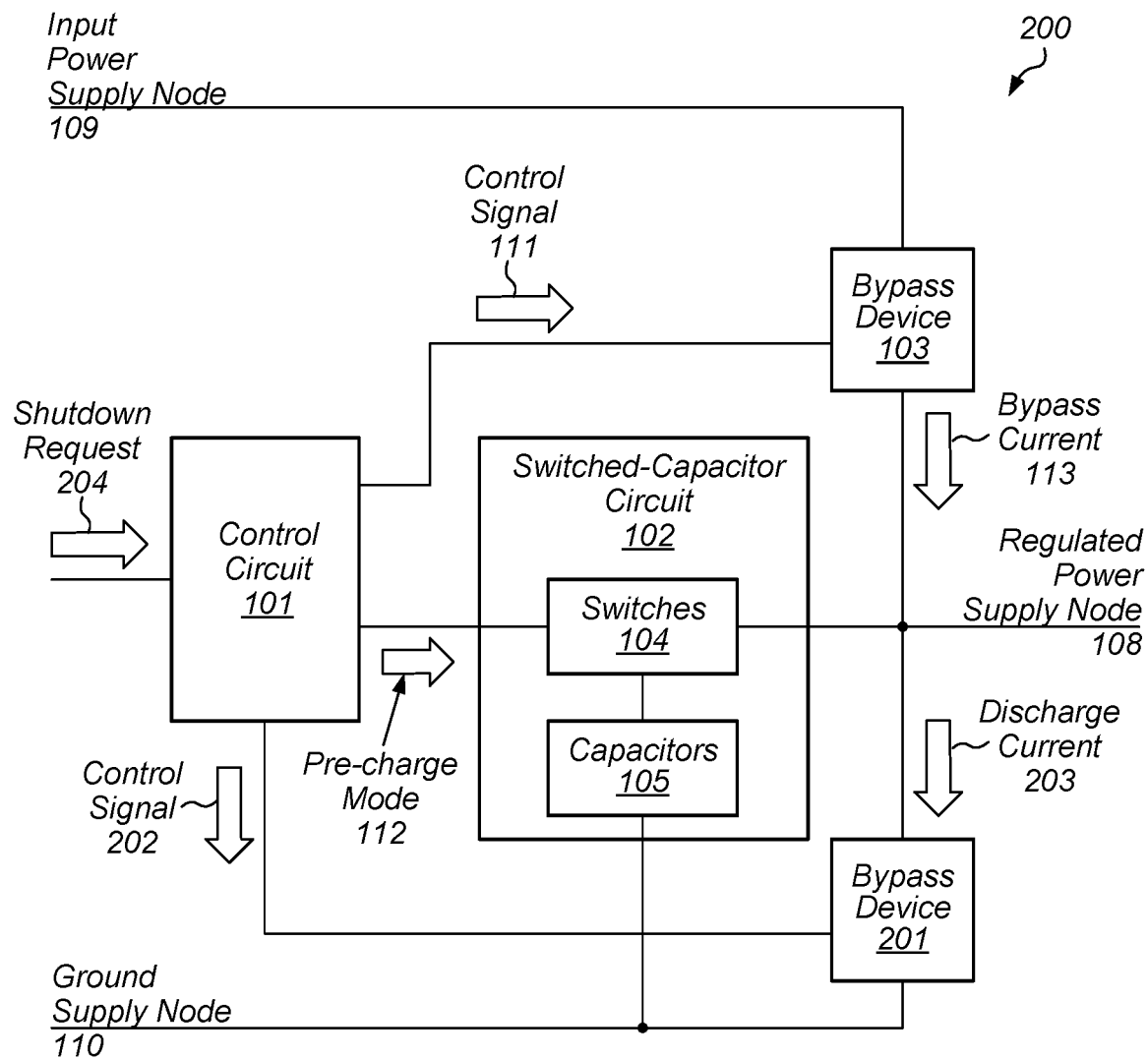
FIG. 2 is a block diagram of another embodiment of a switched-capacitor regulator circuit.

In some cases, the additional linear-type regulation scheme used for startup and upscaling operations may be extended to shutdown and downscaling operations. Turning to FIG. 2, another embodiment of a power converter circuit is depicted that is also used for shutdown and downscaling operations. As illustrated, power converter circuit 200 includes control circuit 101, switched-capacitor circuit 102, bypass device 103, and bypass device 201.

Switched-capacitor circuit 102 includes switches 104 and capacitors 105, and is configured to generate a particular voltage level on regulated power supply node 108 as described above. Bypass device 103 is configured to source bypass current 113 to regulated power supply node 108 based on control signal 111 as described above.

Bypass device 201 is coupled between regulated power supply node 108 and ground supply node 110. In various embodiments, bypass device 201 is configured to sink discharge current 203 from regulated power supply node 108 based on control signal 202. Bypass device 201 may, in some embodiments, be implemented as one or more n-channel MOSFETs or other suitable transconductance devices.

Control circuit 101 is configured to generated control signal 111 as described above. Additionally, control circuit 101 is further configured to generate control signal 202 in response to receiving shutdown request 204. Control signal 202 is used to activate bypass device 201 in order to sink discharge current 203 from regulated power supply node 108. Control circuit 101 is also configured to generate control signal 202 during downscaling events, where the voltage level of regulated power supply node 108 is decreased to a new target level.

In addition to activating and de-activating bypass device 103 and bypass device 201, control circuit 101 may also change an operation mode of switched-capacitor circuit 102 during startup, shutdown, upscaling, and downscaling operations. As used herein, an "operation mode" is a combination of switching frequency and conversion ratio for a switched-capacitor circuit. A switched-capacitor circuit may have many available operation modes, which can be selected by control circuit 101 based on output current demand, target output voltage, input voltage level, and the like.

It is desirable that power converter circuits that employ switched-capacitor circuits maintain high conversion efficiency over a range of operating conditions. In some cases, variation of an input voltage level supplied to the power converter circuit, changes in target output voltage during upscaling or downscaling, or other changes in operating parameters of a power converter circuit, can result in degradation of the conversion efficiency of the power converter circuit. For example, as the output current of a power converter circuit increases, the switching frequency of the power converter circuit will increase until the fast switching limit (FSL) is reached, at which point a conversion ratio of the power converter must be changed to maintain regulation.

As used herein, a conversion ratio is a ratio of an output voltage of a switched-capacitor circuit to an input voltage. In the case of switched-capacitor circuits, the conversion ratio is dependent on circuit topology (e.g., the number of capacitors being used) and may be changed during operation to accommodate different regulation events. To accomplish the change in conversion ratio, different combinations of switches may be used during the charge and discharge period of a given interleave circuit. By using different switches, different amounts of capacitance can be employed during the charge and discharge periods, thereby changing the conversion ratio.

Figure 3:
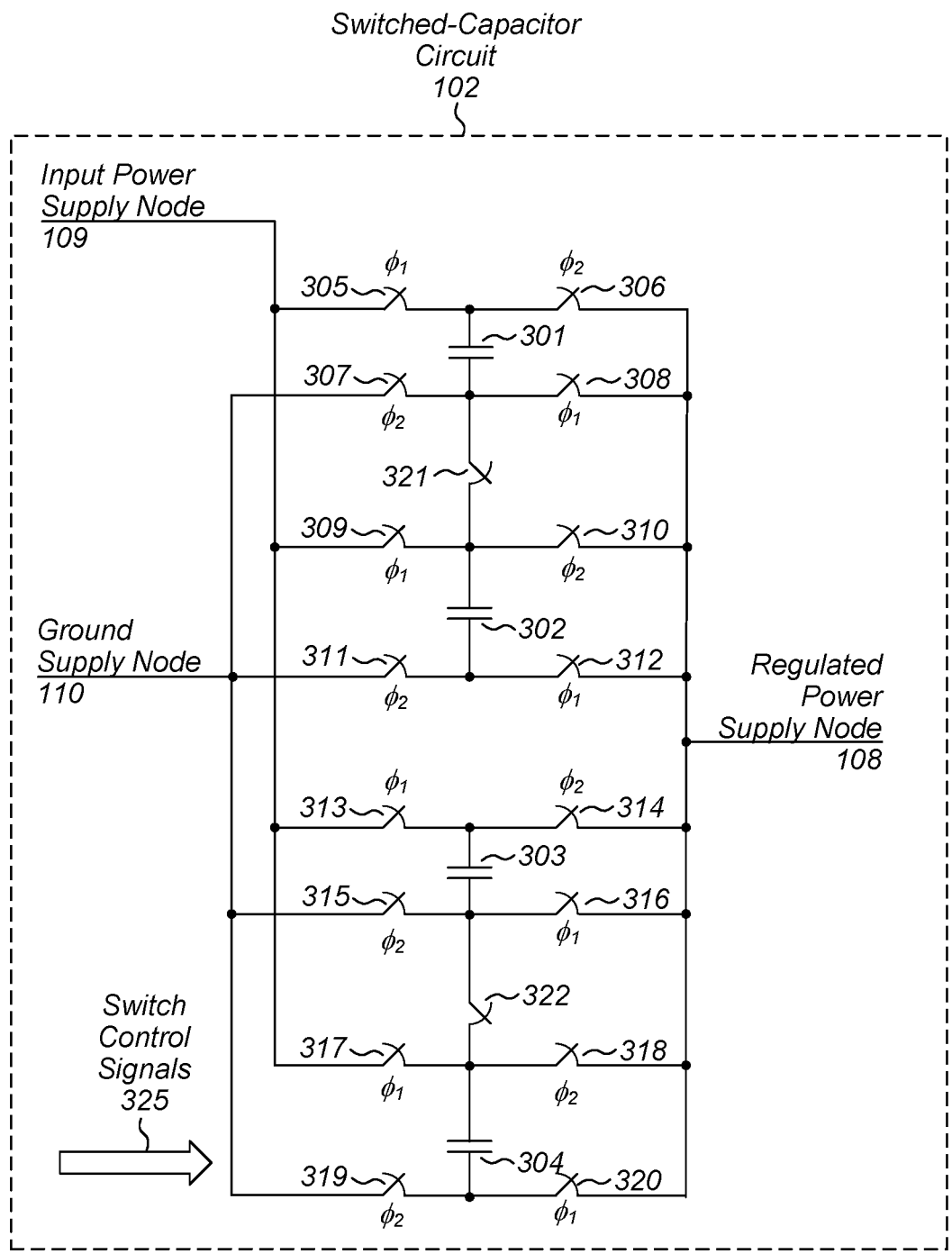
FIG. 3 is a block diagram of an embodiment of a switched-capacitor circuit.

An embodiment of a switched-capacitor circuit 102 is depicted in FIG. 3. As illustrated, switched-capacitor circuit 102 includes capacitors 301-304, as well as switches 305-322, which are connected to respective ones of switch control signals 325. As described below, different ones of switch control signals 325 may be activated in different phases, such as the illustrated phases $\phi_1$ and $\phi_2$. The phase to which a particular one of switch control signal 325 is assigned may be based on a conversion ratio selected for switched-capacitor circuit 102.

Capacitor 301 is coupled to switches 305-308. Switches 306 and 308 are coupled to regulated power supply node 108. The respective switch control signals for switches 306 and 308 are assigned to phases $\phi_2$ and $\phi_1$, respectively. Switch 305 is further coupled to input power supply node 323 and its corresponding switch control signal is assigned to phase $\phi_1$, while switch 307 is coupled ground supply node 324 and its corresponding switch control signal is assigned to phase $\phi_2$.

Capacitor 302 is coupled to switches 309-312. Switches 310 and 312 are coupled to regulated power supply node 108. The respective switch control signals for switches 310 and 312 are assigned to phases $\phi_2$ and $\phi_1$, respectively. Switch 309 is further coupled to input power supply node 109 and its corresponding switch control signal is assigned to phase $\phi_1$, while switch 211 is coupled ground supply node 110 and its corresponding switch control signal is assigned to phase $\phi_2$. Switches 307-310 are also coupled to switch 311. It is noted that the embodiment of switched-capacitor circuit 102 depicted in FIG. 2 is configured to operate using a conversion ratio of 2:1. As such, the corresponding switch control signal for switch 311 is not assigned to either of phases $\phi_1$ or $\phi_2$ and, as such, remains in an open position.

Capacitor 303 is coupled to switches 313-316. Switches 314 and 316 are coupled to regulated power supply node 108. The respective switch control signals for switches 314 and 316 are assigned to phases $\phi_2$ and $\phi_1$, respectively. Switch 305 is further coupled to input power supply node 323 and its corresponding switch control signal is assigned to phase $\phi_1$, while switch 307 is coupled ground supply node 324 and its corresponding switch control signal is assigned to phase $\phi_2$.

Capacitor 304 is coupled to switches 317-320. Switches 318 and 320 are coupled to regulated power supply node 108. The respective switch control signals for switch 318 and switch 320 are assigned to phases $\phi_2$ and $\phi_1$, respectively. Switch 317 is further coupled to input power supply node 109 and its corresponding switch control signal is assigned to phase $\phi_1$, while switch 319 is coupled ground supply node 110 and its corresponding switch control signal is assigned to phase $\phi_2$. Switches 317-320 are also coupled to switch 322. Like the switch control signal for switch 321, the corresponding switch control signal for switch 322 is not assigned to either of phases $\phi_1$ or $\phi_2$ and, as such, remains in an open position.

During operation, switches, whose switch control signals are assigned to phase $\phi_1$, are closed, coupling regulated power supply node 108 to input power supply node 109 via capacitors 301-304. After a particular period of time, switches, whose switch controls signals are assigned to phase $\phi_1$, are closed, and switches whose switch control signals are assigned to phase $\phi_2$ (e.g., switch 306) are closed, coupling each of capacitors 301-304 between regulated power supply node 108 and ground supply node 110. As noted above, switches 321 and 322 remain open during both phases $\phi_1$ and $\phi_2$.

Capacitors 301-304 may, in various embodiments, be discrete components located external to an integrated circuit that includes switches 305-322 and control circuit 101. Switches 305-322 may, in some embodiments, be implemented using one or more MOSFETs or other suitable switching devices. It is noted that although four capacitors and 18 switches are depicted in the embodiment illustrated in FIG. 3, in other embodiments, different numbers of capacitors and switches may be employed.

As illustrated, the switch control signals corresponding to switches 305, 308, 309, 312, 313, 316, 317, and 320 are assigned to phase $\phi_1$. The switch control signals corresponding to switches 306, 321, 311, 314, 322, and 319 are assigned to phase $\phi_2$. The switch control signals corresponding to switches 307, 310, 315, and 318 are not assigned to either phase $\phi_1$ or phase $\phi_2$, thereby allowing switches 307, 310, 315, and 318 to remain open during operation.

During operation, switches 305, 308, 309, 312, 313, 316, 317, and 320 are closed during phase $\phi_1$, thereby coupling capacitors 301 and 302 in series between input power supply node 323 and regulated power supply node 108, as well as coupling capacitors 303 and 304 in series between input power supply node 109 and regulated power supply node 108. When phase $\phi_1$ is complete, switches 305, 308, 309, 312, 313, 316, 317, and 320 are opened, and phase $\phi_2$ begins with the closing of switches 306, 311, 314, 319, 321, and 322. With switches 306, 311, 314, 319, 321, and 322, closed, capacitors 301 and 302 are coupled in series between regulated power supply node 108 and ground supply node 110. In a similar fashion, capacitors 303 and 304 are coupled in series between regulated power supply node 108 and ground supply node 110.

It is noted that the assignments of switch control signals 325 to phases $\phi_1$ and $\phi_2$, as depicted in FIG. 3, are examples. In other embodiments, different conversion ratios may be achieved using other assignments of switch control signals 325 to phases $\phi_1$ and $\phi_2$, or any other suitable phases.

Figure 4:
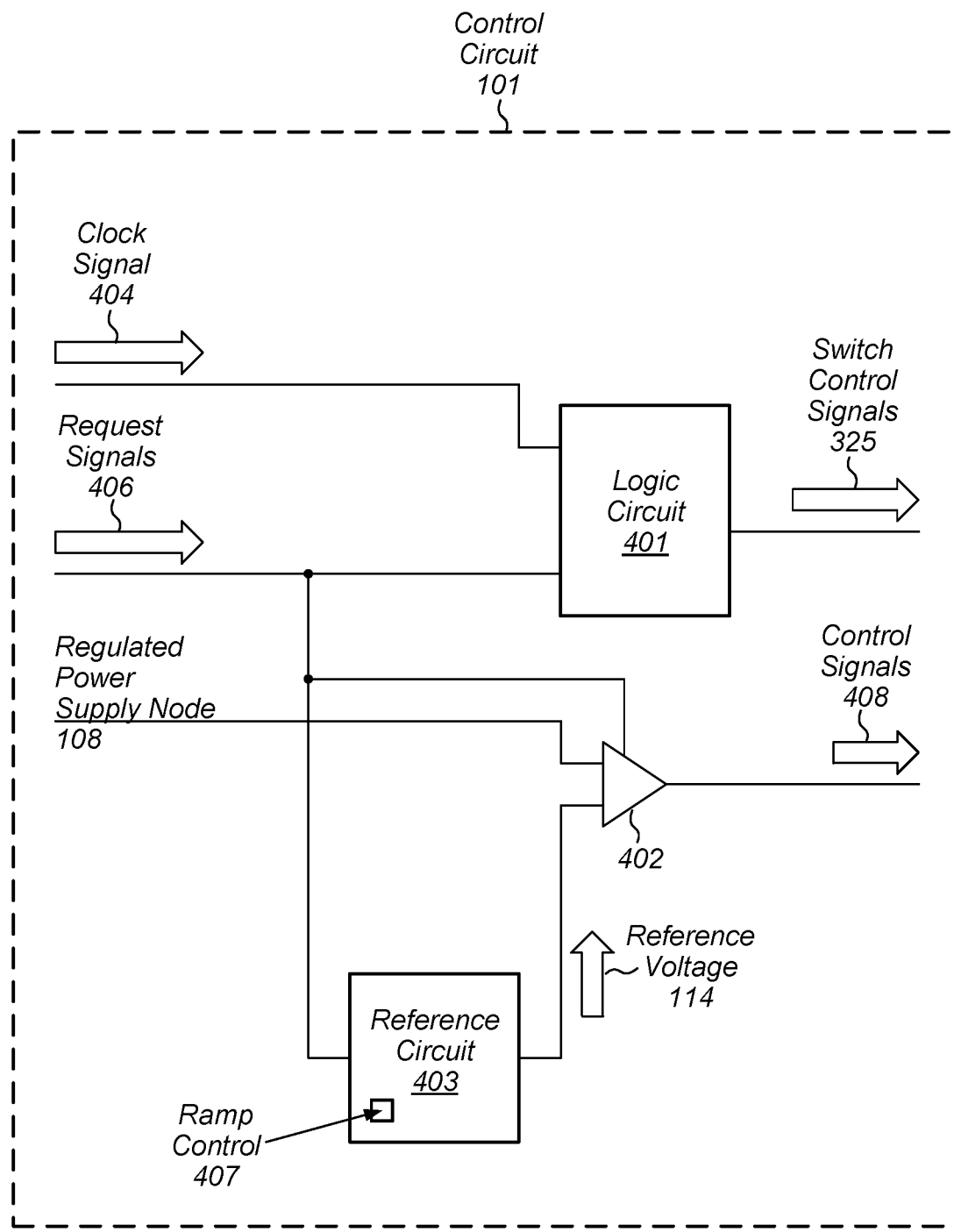
FIG. 4 is a block diagram of a control circuit used in a switched-capacitor regulator circuit.

Turning to FIG. 4, a block diagram of control circuit 101 is depicted. As illustrated, control circuit 101 includes logic circuit 401, comparator circuit 402, and reference circuit 403.

Logic circuit 401 is configured to generate switch control signals 325 using clock signal 404 and request signals 406. In various embodiments, request signals 406 may include startup request 106, shutdown request 204, or a request to change reference voltage 114. Request signals 406 may be used to upscale or downscale the voltage level of regulated power supply node 108 based on power consumption or compute needs of a computer system.

In some embodiments, logic circuit 401 is configured to adjust the timing and phase relationships of different ones of switch control signals 325 to change an operation mode of switched-capacitor circuit 102. By adjusting the phase relationship between different ones of switch control signals 325, logic circuit 401 can adjust which of switches 305-322 are assigned to phase $\phi_1$ and which are assigned to phase $\phi_2$, thereby adjusting the conversion ratio of switched-capacitor circuit 102. Logic circuit 401 may also adjust the switching frequency of switch control signals 325. Logic circuit 401 may be implemented as a controller, state machine, or a general-purpose processor configured to execute software or program instructions.

Reference circuit 403 is configured to generate reference voltage 405. In various embodiments, reference circuit 403 may be configure to generate multiple reference voltage levels, and select a particular one of the reference voltage levels as reference voltage 405 based on request signals 406. Additionally, or alternatively, reference circuit 403 may be configured to transition between different values for reference voltage 405 according to ramp control 407. In various embodiments, ramp control 407 may be programmable. Reference circuit 403 may be implemented as a bandgap reference circuit, or any other suitable voltage reference generator circuit.

Comparator circuit 402 is configured to generate control signals 408 using the voltage level of regulated power supply node 108, reference voltage 405, and request signals 406. In various embodiments, control signals 408 includes control signal 111 and control signal 202. In cases where power converter circuit 100 includes both bypass device 103 and bypass device 201, comparator circuit 402 may include multiple comparison sub-circuits to generate multiple control signals.

In some embodiments, comparator circuit 402 is configured to compare the voltage level of regulated power supply node 108. By directly comparing the voltage level of regulated power supply node 108, comparator circuit 402 can activate either of bypass device 103 or bypass device 201 to assist in adjusting the voltage level of regulated power supply node 108 during a startup operation, a shutdown operation, or change in reference voltage 405 resulting from an upscaling or downscaling operation. Comparator circuit 402 may be implemented as a differential amplifier or other suitable amplifier circuit configured to generate an output signal whose voltage level is a function of a difference between the respective voltage levels of two input signals.

Some computer systems include a dedicated integrated circuit or chip to generate power supply voltage levels for use by other integrated circuits or chips. As previously noted, integrated circuits that generate such power supply voltage levels are referred to as "power management units" or "PMUs." In some cases, PMUs are fabricated using a different semiconductor manufacturing process than that employed to fabricate a system-on-a-chip ("SoC").

There are, however, drawbacks associated with externally generated power supply voltage levels. For example, the load on power supply nodes between a PMU and an SoC, or other integrated circuits, may limit how quickly a particular power supply voltage level may be changed. This can impact the performance of dynamic voltage scaling or other power saving techniques that may be employed on the SoC.

One possible solution is to include a voltage regulator on the SoC that further regulates a power supply voltage level generated by a PMU. Techniques described in the present disclosure use a multi-regulator system to generate a power supply voltage for use by circuits included in a SoC or other integrated circuit. By employing such a multi-regulator circuit, faster transients of the power supply voltage level may be achieved. Moreover, power domains within the SoC may be turned on and off with a lower latency cost, and the power supply voltage level of a particular power domain may be adjusted based on the instantaneous current demand of circuits included in the particular power domain.

Figure 5:
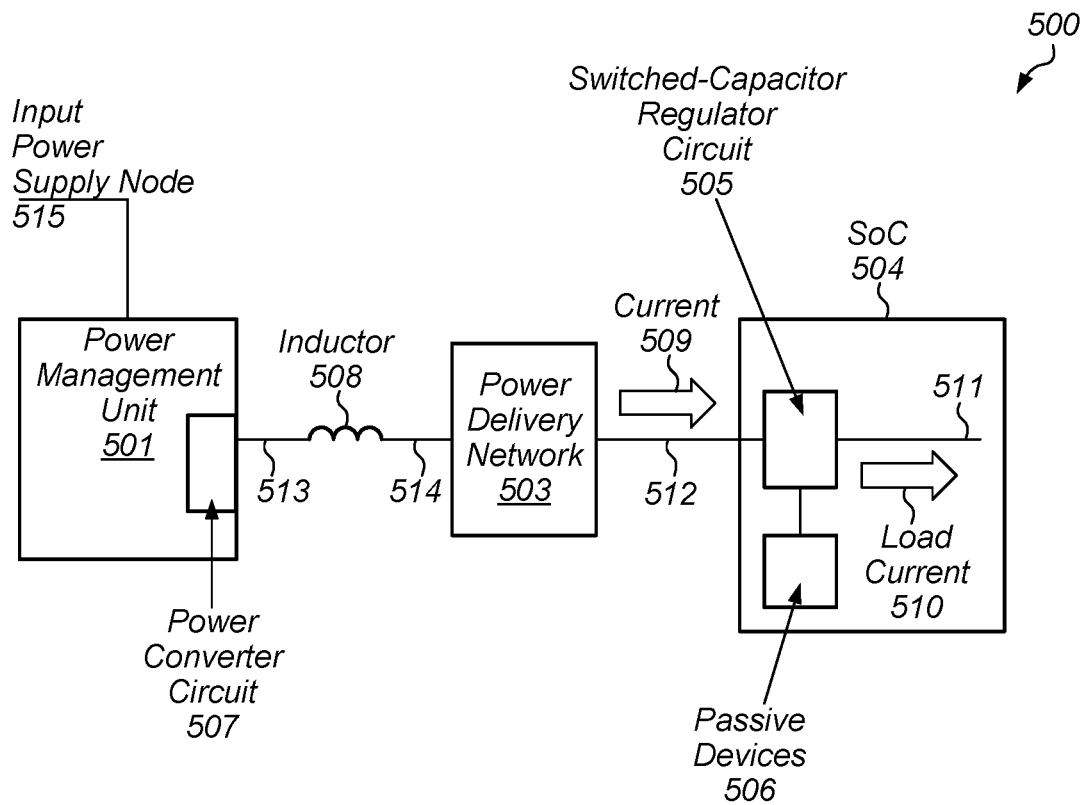
FIG. 5 is a block diagram of a computer system including a power management unit and a system-on-a-chip.

Turning to FIG. 5, a block diagram of a multi-regulator system is depicted. As illustrated, multi-regulator system 500 includes power management unit 501, power delivery network 503, and SoC 504. Although only a single SoC is depicted in the embodiment of FIG. 5, in other embodiments, multiple SoCs may be coupled to power management unit 501.

Power management unit 501 includes power converter circuit 507. In various embodiments, power converter circuit 507 is configured to generate a particular voltage level on node 514 using a voltage level of input power supply node 515 and inductor 508. In some cases, input power supply node 515 may be coupled to a battery or other suitable power supply circuit. Power converter circuit 507 may be implemented as a buck converter, or other suitable switching converter circuit. In some cases, inductor 508 may be co-located on power management unit 501, or may be located on a separate integrated circuit or chip that includes multiple passive circuit elements.

Power delivery network 503 is configured to couple node 513 to node 512, allowing current 509 to be drawn by SoC 504 from node 512. As described below, power delivery network 503 can include multiple passive circuit elements configured to minimize voltage droop on node 512 due to variations in current 509.

SoC 504 includes switched-capacitor regulator circuit 505 and passive devices 506. Switched-capacitor regulator circuit 505 is configured to generate a particular voltage level on node 511 and provide load current 510 to sub-circuits included in SoC 504 (not shown). As described below, switched-capacitor regulator circuit 505 includes multiple switches and at least one capacitor. SoC 504 may, in various embodiments, include multiple circuit blocks configured to perform respective tasks. For example, SoC 504 may include one or more processor circuits, one or more memory circuits, etc.

During a startup operation, power converter circuit 507 is configured to ramp up the voltage level on node 14 to an initial value. The initial value may be between a range of values whose lower limit is based on threshold voltages of the devices included in switched-capacitor regulator circuit 505, and whose upper limit is based on the voltage ratings of the devices included in switched-capacitor regulator circuit 505.

As the voltage level on node 514 increases, so does the voltage level on node 512. Switched-capacitor regulator circuit 505 may employ a bypass device (e.g., bypass device 103) to begin increasing the voltage level of node 511 in response to the increase in the voltage level of node 512. Alternatively, SoC 504 may include a low-dropout (LDO) regulator circuit that is configured to initially increase the voltage level of node 511 in response to the increase of the voltage level of node 512. In response to an increase in the voltage level of node 511, the voltage level of node 512 also increases. The respective voltages across devices in switched-capacitor regulator circuit 505, however, are to be kept within specified limits to prevent damage to the devices during such voltage level increases.

As the voltage level on node 511 begins to increase, switched-capacitor regulator circuit 505 is configured to begin to operate, regulating the voltage level of node 511 to a target value. As described above, once the voltage level of node 511 reaches a pre-charge level, the bypass device (or LDO regulator circuit) may be deactivated, and switched-capacitor regulator circuit continues to increase the voltage level of node 511 to the target value.

Once switched-capacitor regulator circuit 505 has been activated, power converter circuit 507 increases the voltage level on node 514 to a final value, with switched-capacitor regulator circuit 505 tracking the increase in voltage level from power converter circuit 507. In various embodiments, the voltage level of node 511 is less than the voltage level of nodes 514 and 512. For example, the voltage level of node 511 may be half of the voltage level of node 512.

During a shutdown operation, power converter circuit 507 is configured to decrease the voltage level of node 514. In various embodiments, the reduced voltage level of node 514 may fall within the range used during a startup operation. Switched-capacitor regulator circuit 505 is configured to track the reduction in the voltage levels of nodes 514 and 512, reducing the voltage level of node 511. Once the voltage level of node 514 is within the specified range, switched-capacitor regulator circuit 505 is de-activated along with power converter circuit 507. In some embodiments, switched-capacitor regulator circuit 505 may be de-activated in response to a determination that the voltage level of node 511 is less than a shutdown value, and power converter circuit 507 may be de-activated in response to a determination that switched-capacitor regulator circuit 505 has been de-activated. Nodes 511, 512, and 514, may be discharged to ground using respective resistors. Alternatively, nodes 511, 512, and 514 may be allowed to slowly discharge to ground through leakage currents from devices attached to those nodes.

Figure 6:
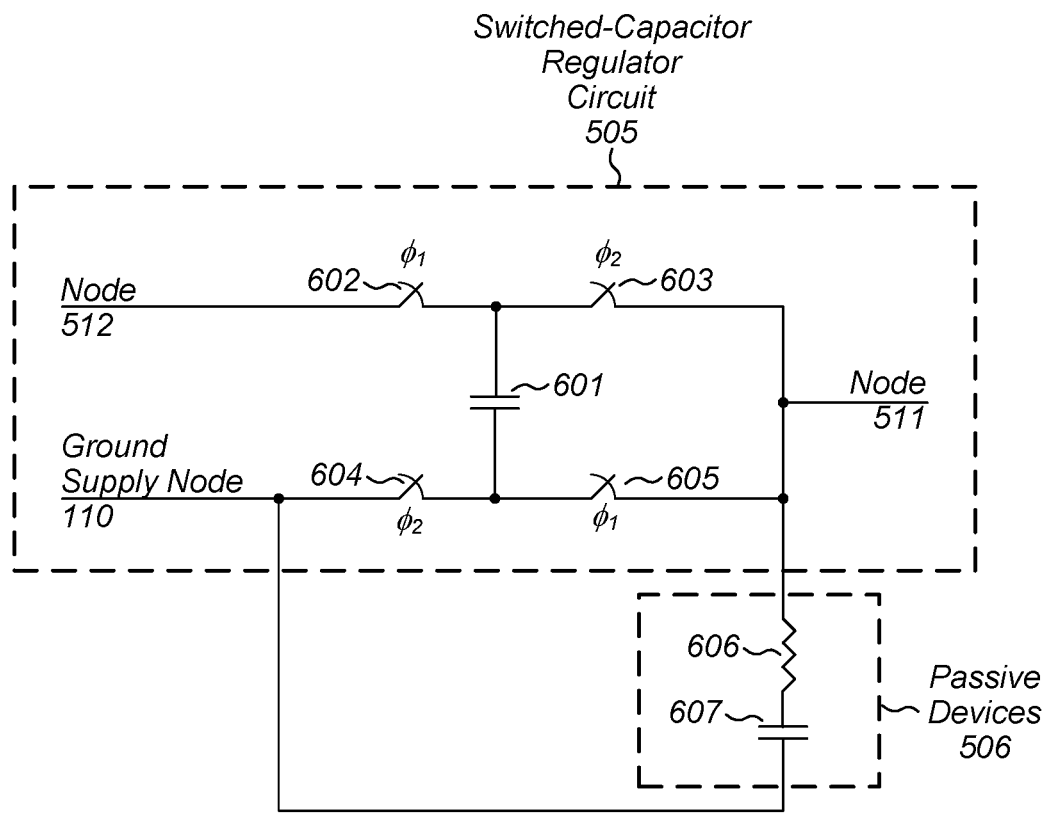
FIG. 6 is a block diagram of a different embodiment of a voltage regulator circuit.

Turning to FIG. 6, a block diagram of embodiments of switched-capacitor regulator circuit 505 and passive devices 506 are depicted. As illustrated, switched-capacitor regulator circuit 505 includes capacitor 601, and switches 602-605, while passive devices 506 includes resistor 606 and capacitor 607.

Switch 602 is coupled between node 512 and a first terminal of capacitor 601, while switch 603 is coupled between the first terminal of capacitor 601 and node 511. In a similar fashion, switch 604 is coupled between ground supply node 110 and a second terminal of capacitor 601, while switch 605 is coupled between the second terminal of capacitor 601 and node 511.

When switched-capacitor regulator circuit 505 is inactive, switches 602-605 are open. As described above, in response to a startup operation, switches 602-605 are opened and closed according to which of phase $\phi_1$ and phase $\phi_2$ controls them.

When phase $\phi_1$ is activated, switches 602 and 605 are closed, coupling capacitor 601 between node 512 and node 511. The voltage across the capacitor 601 can be expressed as shown in Equation 1, where $V_{node\_511}$ is the voltage of node 511 and $V_{node\_512}$ is the voltage of node 512

$$V_{cap} = V_{node\_511} - V_{node\_512} \quad (1)$$

During phase $\phi_2$, switches 602 and 605 are open, and switches 603 and 604 are closed. In this case, the voltage across capacitor 601 can be expressed as shown in Equation 2.

$$V_{cap} = V_{node\_511} \quad (2)$$

Equations 1 and 2, can be used to solve for the voltage level on node 512 as shown in Equation 3. As depicted in Equation 3, the output voltage of switched-capacitor regulator circuit 505 (i.e., the voltage on node 511) is half of the input voltage (i.e., the voltage on node 512) supplied to switched-capacitor regulator circuit 505. It is noted that although this particular arrangement and operation of switches results in an output voltage that is half of an input voltage, in other embodiments, different numbers and arrangements of switches can result in different relationships between the output voltage and the input voltage.

$$V_{node\_511} = \frac{V_{node\_512}}{2} \quad (3)$$

In some cases, switches 602-605 may be implemented as fully complementary pass gates including both a p-channel MOSFET and a n-channel MOSFET, or any other switching device compatible with passing analog voltage levels. In other cases, switches 602 and 605 may be implemented as p-channel MOSFETs, while switches 603 and 604 may be implemented as n-channel MOSFETs. Capacitor 601 may be implemented as a metal-oxide-metal (MOM) capacitor, a metal-insulator-metal (MIM) capacitor, or any other capacitor structure available in a semiconductor manufacturing process.

Resistor 606 is coupled to node 511 and capacitor 607, which is, in turn coupled to ground supply node 110. In various embodiments, resistor 606 and capacitor 607 are configured to attenuate particular frequency components on node 511. Moreover, resistor 606 and 607 can leak charge from node 511 to allow node 511 to slowly reach ground potential at the end of a shutdown operation. It is noted that although only a single resistor and capacitor are depicted in passive devices 506, in other embodiments, any suitable number of resistors and capacitors may be employed.

Resistor 606 may be implemented as a metal resistor, a polysilicon resistor, or a resistor made from any other material available in a semiconductor manufacturing process. Capacitor 607 may be implemented as a MOM capacitor, a MIM capacitor, or any other capacitor structure available in a semiconductor manufacturing process. In some embodiments, passive devices 506 may be located on an integrated circuit different from the integrated circuit that includes switched-capacitor regulator circuit 505.

Figure 7:
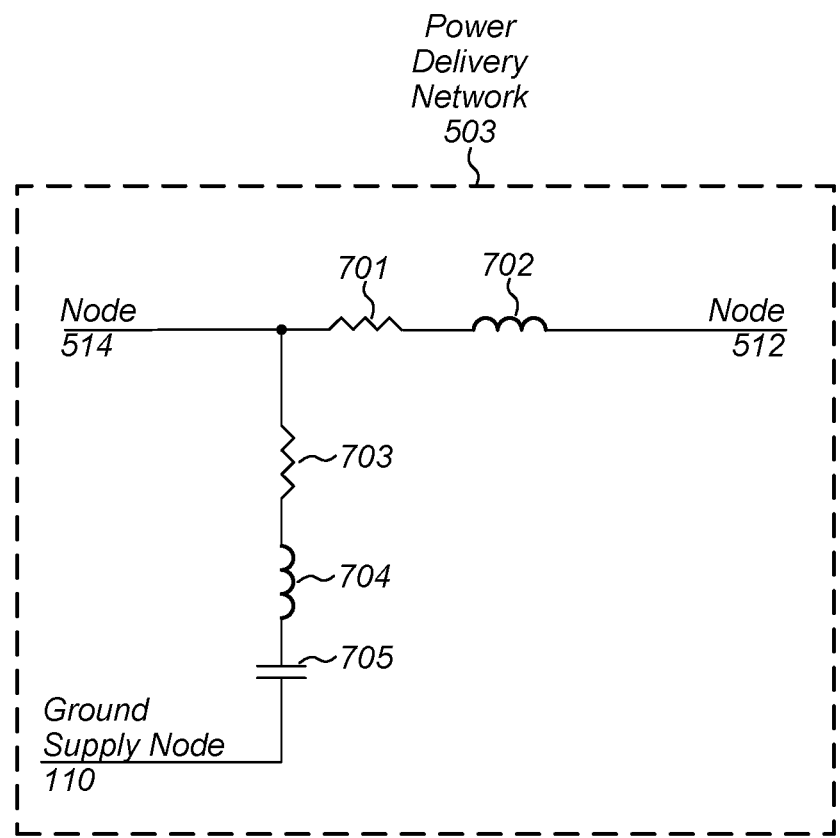
FIG. 7 is a block diagram of a power distribution network.

A block diagram of an embodiment of power delivery network 503 is depicted in FIG. 7. As illustrated, power delivery network 503 includes resistors 701 and 703, inductors 702 and 704, and capacitor 705.

Resistor 701 is coupled between node 514 and inductor 702, which is, in turn, coupled to node 512. Resistor 703 is coupled to node 514 and inductor 704. Capacitor 705 is coupled between inductor 704 and ground supply node 110. In various embodiments, respective magnetic fields of inductors 702 and 704, along with the capacitance of capacitor 705 may provide energy storage that can supplement current sourced to node 512 during load transients on node 512. Additionally, the resistor 703, inductor 704, and capacitor 705 may be configured to provide a frequency-dependent impedance between node 514 and ground supply node 110, that can attenuate certain frequency components present in the voltage level of node 514, thereby preventing such frequency components from being passed to node 512.

Resistors 701 and 703 may be implemented as metal resistors, polysilicon resistors, or resistors made from any suitable layer available in a semiconductor manufacturing process. Inductors 702 and 704 may be implemented as planar coils fabricated on a metal layer available on a semiconductor manufacturing process. Capacitor 705 may be implemented as a MOM capacitor, a MIM capacitor, or any other suitable capacitor type. In various embodiments, any of resistors 701 and 703, inductors 702 and 704, and capacitor 705 may be located on a separate integrated circuit that includes other passive circuit elements.

It is noted that the component values for resistors 701 and 703, inductors 702 and 704, and capacitor 705 may be selected based on a desired amount of voltage droop on node 512 during load current transients. Alternatively, the component values may be selected based on a desired level of filtering to be performed.

Figure 8:
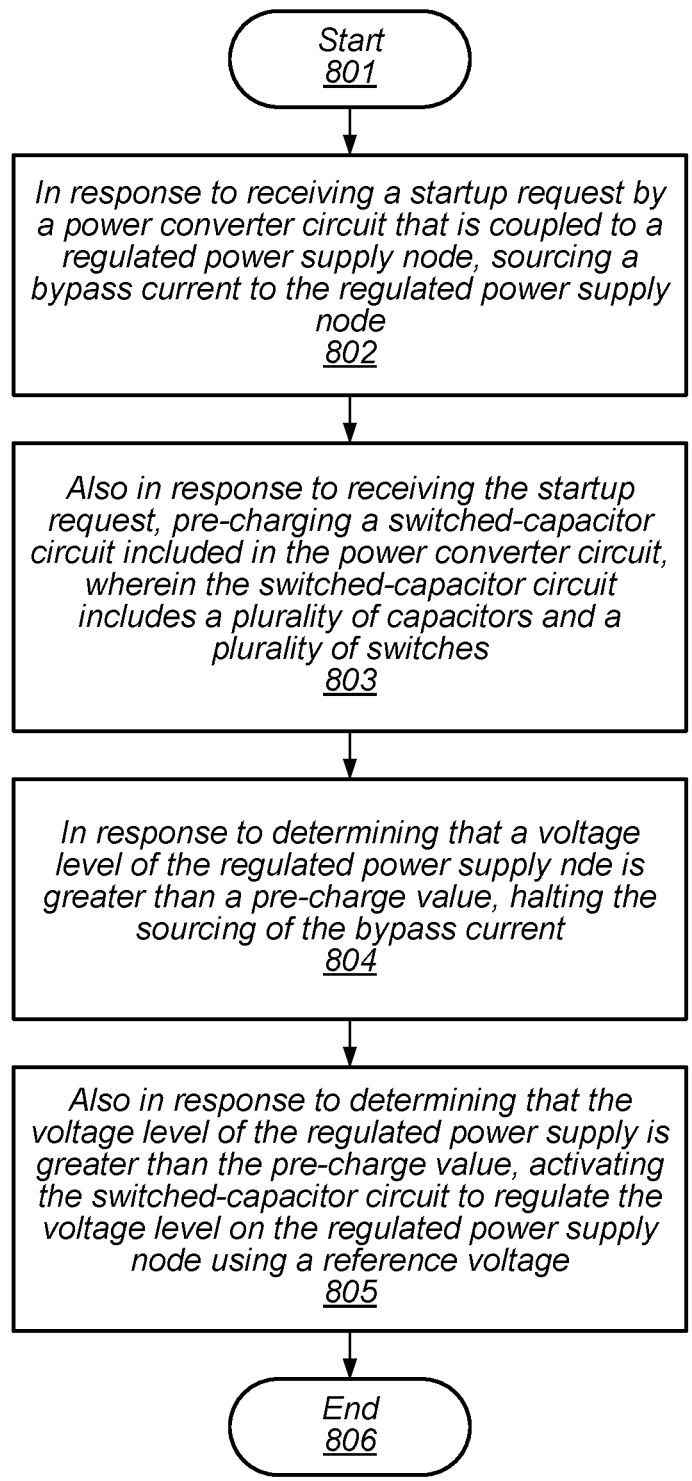
FIG. 8 depicts a flow diagram illustrating an embodiment of a method for operating a switched-capacitor voltage regulator circuit.

Turning to FIG. 8, a flow diagram depicting an embodiment of a method for operating a power converter circuit is illustrated. The method, which begins in block 801, may be applied to various power converter circuits, such as power converter circuit 100 as illustrated in FIG. 1.

The method includes, in response to receiving a startup request by a power converter circuit that is coupled to a regulated power supply node, sourcing a bypass current to the regulated power supply node (block 802). In some embodiments, the startup request may be generated by a power management unit or other suitable circuit. The startup request may be generated in response to a power-on event for a computer system, or a return to an active state for a circuit that receives power from the power converter circuit. In some cases, sourcing the bypass current may include activating a bypass device coupled between an input power supply node and the regulated power supply node.

The method further includes, also in response to receiving the startup request, pre-charging a switched-capacitor circuit included in the power converter circuit, where the switched-capacitor circuit includes a plurality of capacitors and a plurality of switches (block 803). In various embodiments, pre-charging the switched-capacitor circuit includes discharging the plurality of capacitors to ground. In order to discharge the plurality of capacitors, different ones of the plurality of switches may be closed to couple the plurality of capacitors to a ground supply node.

The method also includes, in response to determining that a voltage level of the regulated power supply node is greater than a pre-charge value, halting the sourcing of the bypass current (block 804). In various embodiments, determining that the voltage level of the regulated power supply node is greater than the pre-charge value includes comparing, using a differential amplifier circuit, the voltage level of the regulated power supply node to a different voltage level corresponding to the pre-charge value.

Also, in response to determining that the voltage level of the regulated power supply node is greater than the pre-charge value, the method further includes activating the switched-capacitor circuit to regulate the voltage level of the regulated power supply node using a reference voltage (block 805). In various embodiments, activating the switched-capacitor regulator circuit includes activating a plurality of control signals coupled to the plurality of switches included in the switched-capacitor circuit. The method concludes in block 806.

Figure 9:
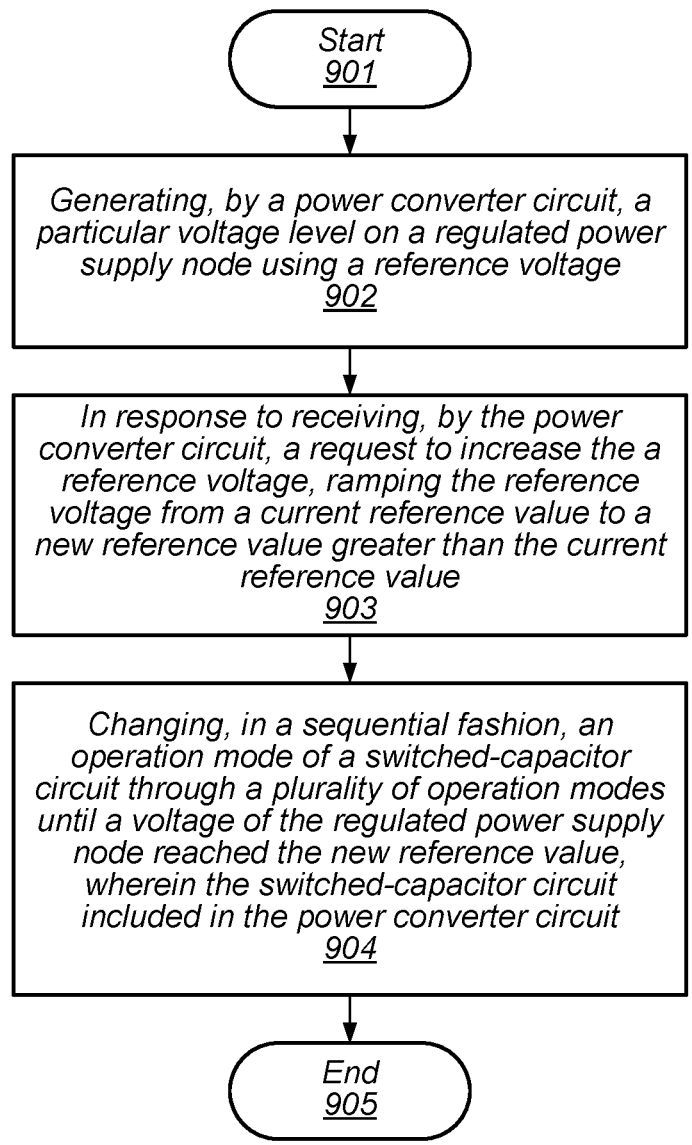
FIG. 9 depicts a flow diagram illustrating an embodiment of a method for upscaling an output voltage of a power converter circuit.

Turning to FIG. 9, a flow diagram depicting an embodiment of a method for upscaling an output voltage of a power converter circuit is illustrated. The method, which may be applied to power converter circuit 100 as depicted in FIG. 1, begins in block 901.

The method includes generating, by a power converter circuit, a particular voltage level on a regulated power supply node using a reference voltage (block 902). In various embodiments, generating the particular voltage level on the regulated power supply node includes charging a subset of a plurality of capacitors included in the power converter circuit, and discharging one or more of the subset of the plurality of capacitors into the regulated power supply node.

The method also includes, in response to receiving, by the power converter circuit, a request to increase the reference voltage, ramping the reference voltage from a current reference value to a new reference value greater than the current reference value (block 903). In various embodiments, ramping the reference voltage includes changing the reference voltage according to a programmable ramp time.

The method further includes changing, in a sequential fashion, an operation mode of a switched-capacitor circuit through a plurality of operation modes until a voltage of the regulated power supply node has reached the new reference value, wherein the switched-capacitor circuit is included in the power converter circuit (block 904). In various embodiments, different ones of the plurality of operation modes include different switching rates of control signals, and different conversion ratios. The method concludes in block 905.

Figure 10:
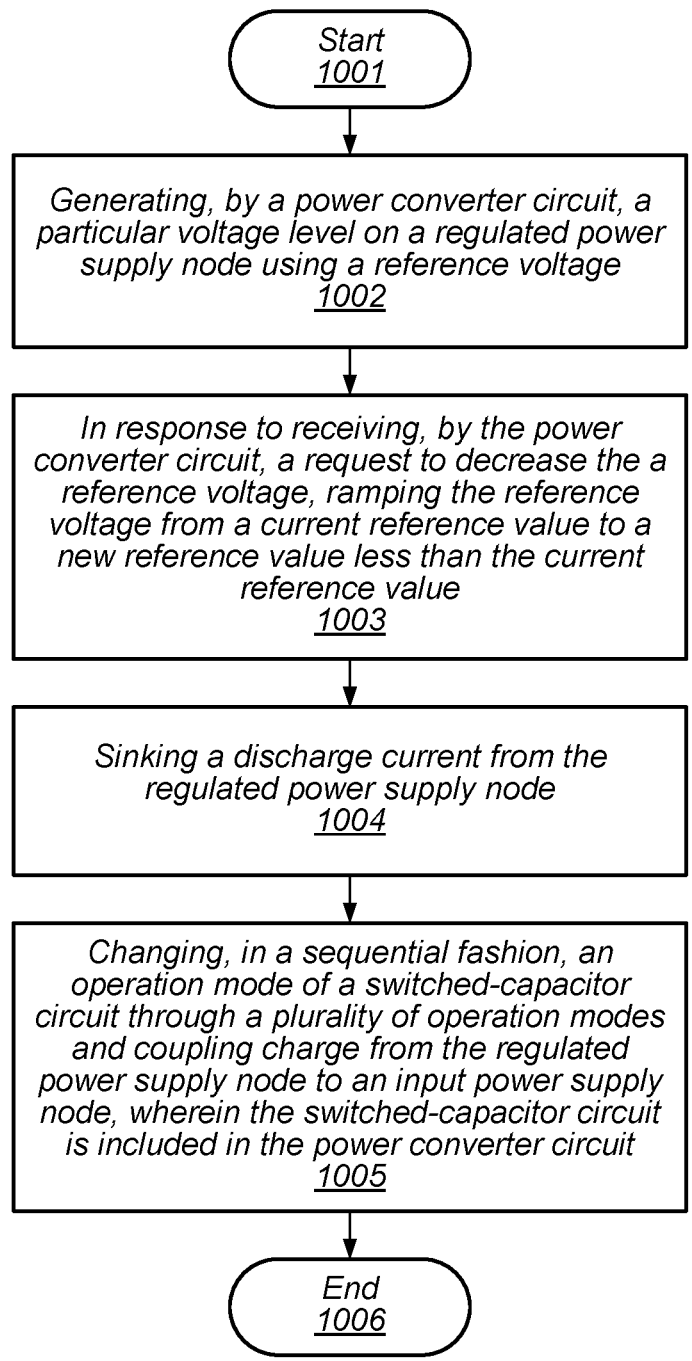
FIG. 10 depicts a flow diagram illustrating an embodiment of a method for downscaling an output voltage of a power converter circuit.

Turning to FIG. 10, a flow diagram depicting an embodiment of a method for downscaling an output voltage of a power converter circuit is illustrated. The method, which may be applied to power converter 200 as depicted in FIG. 2, begins in block 1001.

The method includes generating, by a power converter circuit, a particular voltage level on a regulated power supply node using a reference voltage (block 1002). In various embodiments, generating the particular voltage level on the regulated power supply node includes charging a subset of a plurality of capacitors included in the power converter circuit, and discharging one or more of the subset of the plurality of capacitors into the regulated power supply node.

The method also includes, in response to receiving, by the power converter circuit, a request to decrease the reference voltage, ramping the reference voltage from a current reference value to a new reference value less than the current reference value (block 1003). In various embodiments, a time associated with ramping the reference voltage may be programmable.

The method further includes sinking a discharge current from the regulated power supply node (block 1004). In various embodiments, sinking the discharge current includes activating a bypass device coupled between the regulated power supply node and a ground supply node.

The method also includes changing, in a sequential fashion, an operation mode of a switched-capacitor circuit through a plurality of operation modes and coupling charge from the regulated power supply node to an input power supply node, where the switched-capacitor circuit is included in the power converter node (block 1005). In various embodiments, different ones of the plurality of operation modes include different switching rates of control signals, and different conversion ratios. The method concludes in block 1006.

Figure 11:
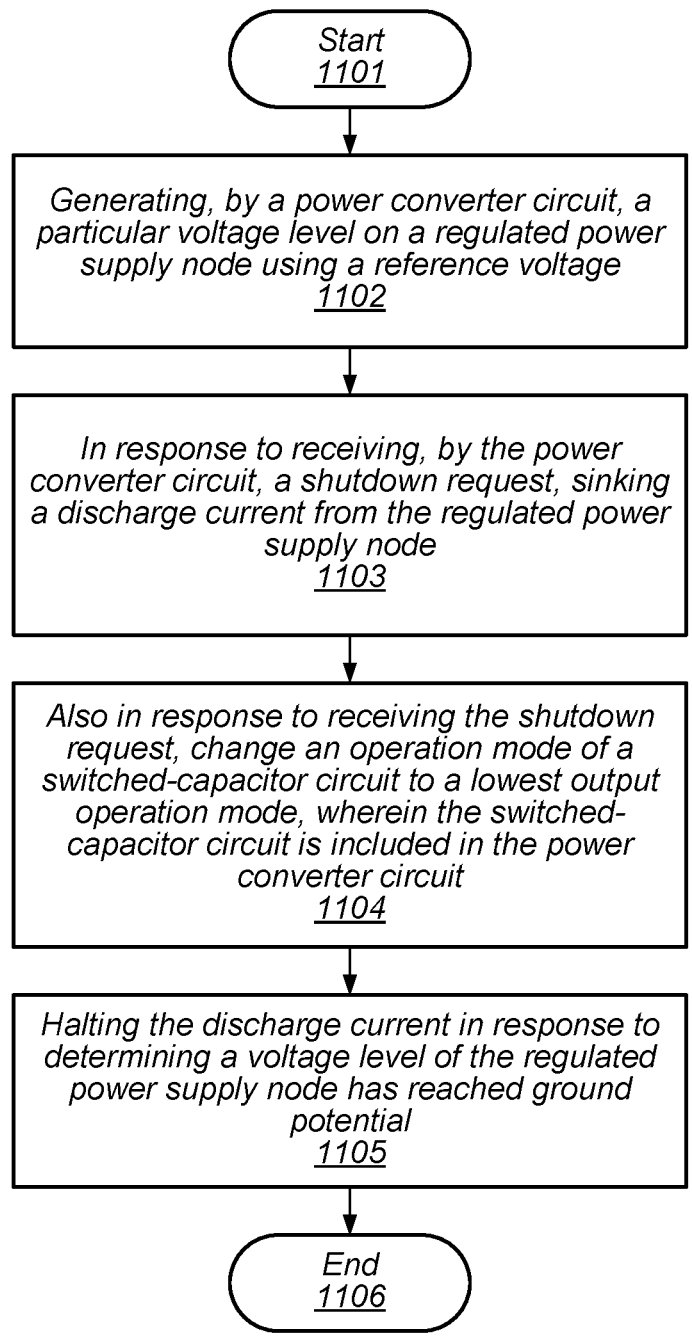
FIG. 11 depicts a flow diagram illustrating an embodiment of a method for performing a shutdown operation for a power converter circuit.

A flow diagram depicting an embodiment of a method for performing a shutdown operation on a power converter circuit is illustrated in FIG. 11. The method, which may be applied to power converter circuit 200 as depicted in FIG. 2, begins in block 1101.

The method includes generating, by a power converter circuit, a particular voltage level on a regulated power supply node using a reference voltage (block 1102). In various embodiments, generating the particular voltage level on the regulated power supply node includes charging a subset of a plurality of capacitors included in the power converter circuit, and discharging one or more of the subset of the plurality of capacitors into the regulated power supply node.

The method also includes, in response to receiving a shutdown request, by the power converter circuit, sinking a discharge current from the regulated power supply node (block 1103). In some embodiments, the shutdown request may be in response to activating a power down or sleep mode of a computer system. Sinking the discharge current may, in some embodiments, include activating a bypass device coupled between the regulated power supply node and a ground supply node.

Also, in response to receiving the shutdown request, the method includes changing an operation mode of a switched-capacitor circuit, included in the power converter circuit, to a lowest output mode, where the switched-capacitor circuit provides a lowest amount of current to a load circuit of the available operation modes (block 1104). In various embodiments, changing the operation mode may include changing a conversion ratio of switched-capacitor circuit. Additionally, changing the operation mode may include changing a switching rate of a plurality of control signals coupled to a plurality of switches included in the switched-capacitor circuit.

The method further includes halting the discharge current in response to determining a voltage level of the regulated power supply node has reached ground potential (block 1105). In various embodiments, halting the discharge current may include de-activating the bypass device coupled between the regulated power supply node and the ground supply node. The method concludes in block 1106.

Figure 12:
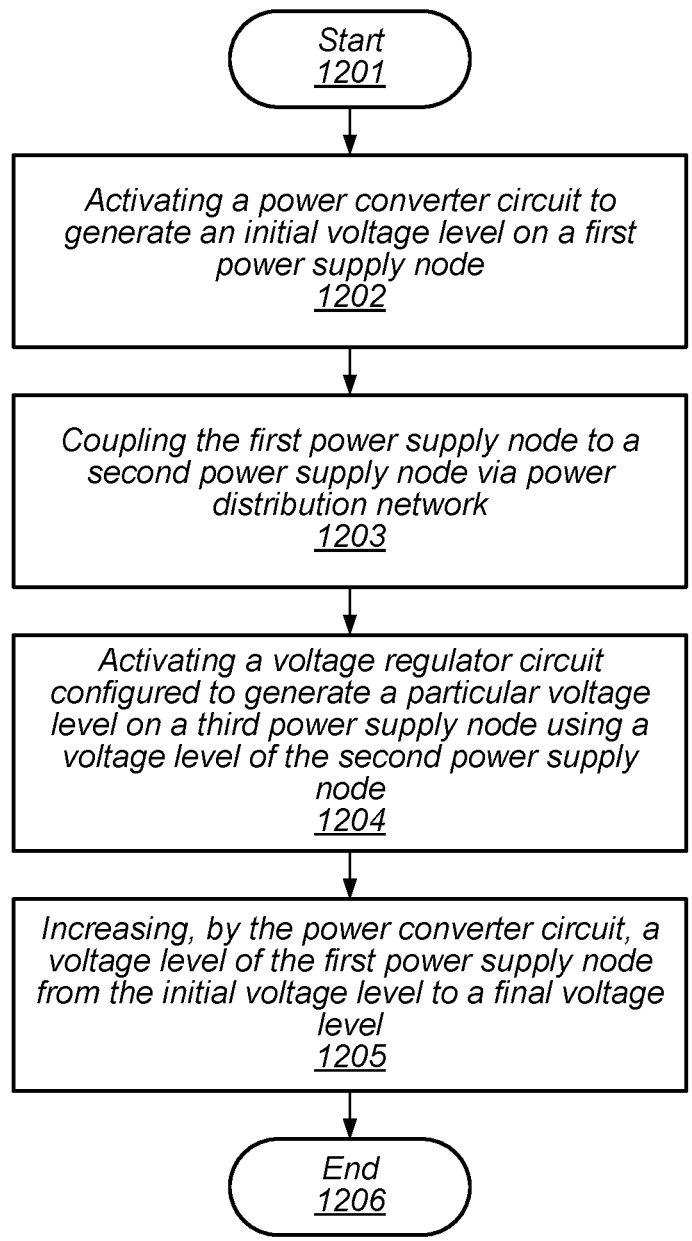
FIG. 12 depicts a flow diagram illustrating an embodiment of a method for performing a startup operation for a multi-regulator system.

Turning to FIG. 12, a flow diagram depicting an embodiment of method for performing a startup operation for multi-regulator system is illustrated. As described above, the multi-regulator system may include a power converter circuit and a voltage regulator circuit. In some cases, the power converter circuit and the voltage regulator circuit may be located on different integrated circuits. The method, which may be applied to computer system 500 as depicted in FIG. 5, begins in block 1201.

The method includes activating a power converter circuit to generate an initial voltage level on a first power supply node (block 1202). In various embodiments, the power converter circuit may include a buck converter circuit or other suitable switching-regulator circuit. In some cases, the initial voltage level may be within a range of voltages. The lower limit of the range may be based on threshold voltage of devices included in the voltage regulator circuits, and the upper limit of the range may be based on maximum voltage ratings of the devices included in the voltage regulator circuit.

The method also includes coupling the first power supply node to a second power supply node via a power distribution network (block 1203). In some embodiments, the power distribution network may include a plurality of passive circuit elements. For example, the power distribution network may include a combination of resistors, capacitors, and inductors. The method may include filtering, by the power distribution network, a voltage level on the first power supply node to generate a voltage level on the second power supply node.

The method further includes activating a voltage regulator circuit to generate a particular voltage level on a third power supply node using a voltage level of the second power supply node (block 1204). In some case, the voltage regulator circuit may include a switched-capacitor circuit coupled to a third power supply node, and a bypass device coupled between the second power supply node and the third power supply node. Generating the particular voltage level on the third power supply node may include activating the switched-capacitor circuit and the bypass device.

The method also includes increasing, by the power converter circuit, a voltage level of the first power supply node from the initial voltage level to a final voltage level (block 1205). In various embodiments, increasing the voltage level of the first power supply node may include changing a reference voltage used by the power converter circuit from a first value to a second value greater than the first value. The method concludes in block 1206.

Figure 13:
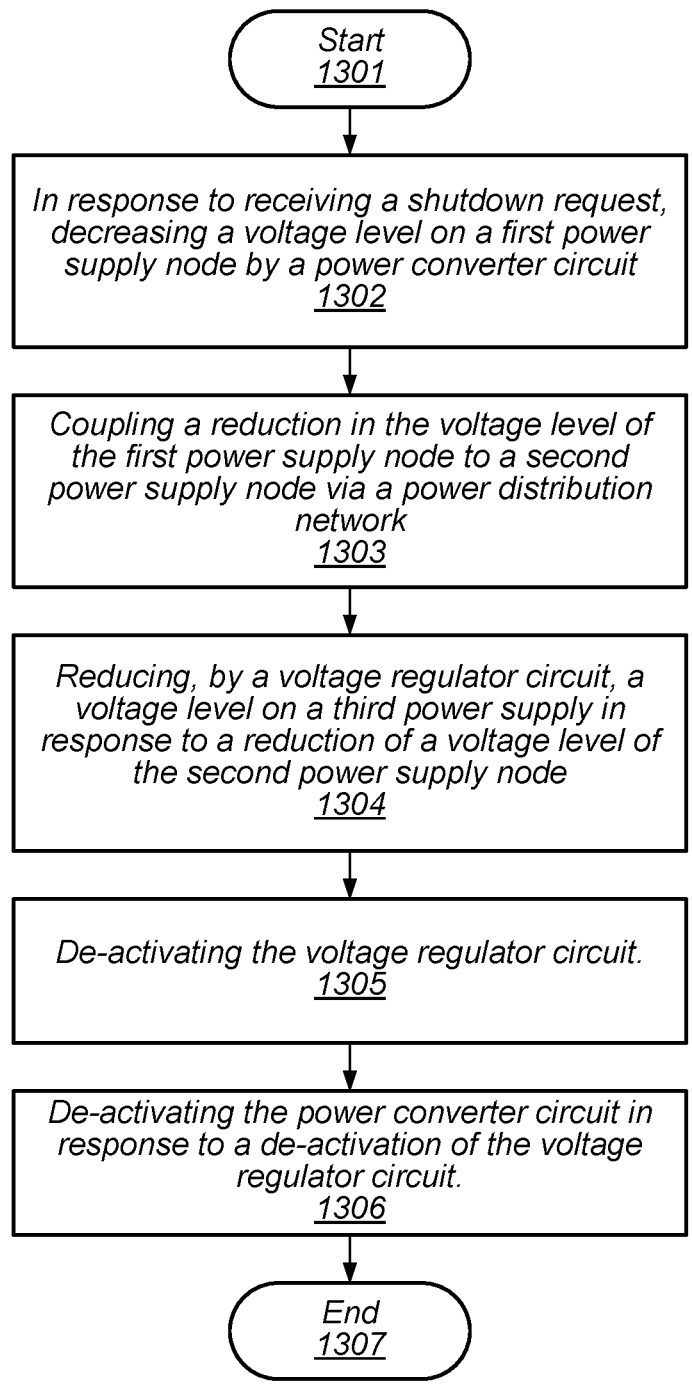
FIG. 13 depicts a flow diagram illustrating an embodiment of a method for performing a shutdown operation for a multi-regulator system.

Turning to FIG. 13, a flow diagram depicting an embodiment of a method for performing a shutdown operation for a multi-regulator system is illustrated. As described above, the multi-regulator system may include a power converter circuit and a voltage regulator circuit. In some cases, the power converter circuit and the voltage regulator circuit may be located on different integrated circuits. The method, which may be applied to computer system 500 as depicted in FIG. 5, begins in block 1301.

The method includes, in response to receiving a shutdown request, decreasing a voltage level on a first power supply node by a power converter circuit (block 1302). In various embodiments, the shutdown request may be in response to activating a power down or sleep mode of a computer system. In some cases, decreasing the voltage level on the first power supply node includes changing a reference voltage used by the power converter circuit from a first value to a second value that is less than the first value.

The method also includes coupling a reduction in the voltage level of the first power supply node to a second power supply node via a power distribution network (block 1303). In some embodiments, the power distribution network may include a plurality of passive circuit elements. The method may include filtering, by the power distribution network, particular frequency components of a voltage level on the first power supply node to generate a voltage level on the second power supply node.

The method further includes reducing, by a voltage regulator circuit, a voltage level of a third power supply node in response to a reduction of a voltage level of the second power supply node (block 1304). In various embodiments, the voltage regulator circuit includes a switched-capacitor circuit. Reducing the voltage level of the third power supply node may include changing respective frequencies of control signals coupled to a plurality of switches included in the switched-capacitor circuit. In some embodiments, reducing the voltage level of the third power supply node may include changing a conversion ratio of the switched-capacitor circuit.

The method also includes de-activating the voltage regulator circuit in response to determining the voltage level of the third supply node is less than a shutdown value (block 1305). In various embodiments, de-activating the voltage regulator circuit may include stopping the control signals coupled to the plurality of switches included in the switched-capacitor circuit. In some cases, the method may further include discharging a plurality of capacitors included in the switched-capacitor circuit.

The method further includes de-activating the power converter circuit, in response to a de-activation of the voltage regulator circuit (block 1306). In some embodiments, de-activating the power converter circuit includes placing an output circuit of the power converter into a high-impedance state. By first reducing the voltage level of the first power supply node, and then de-activating the voltage regulator circuit prior to de-activating the power converter circuit, voltage levels across devices in the voltage regulator circuit are maintained within specified limits, thereby preventing damage to the devices. The method ends in block 1307.

Figure 14:
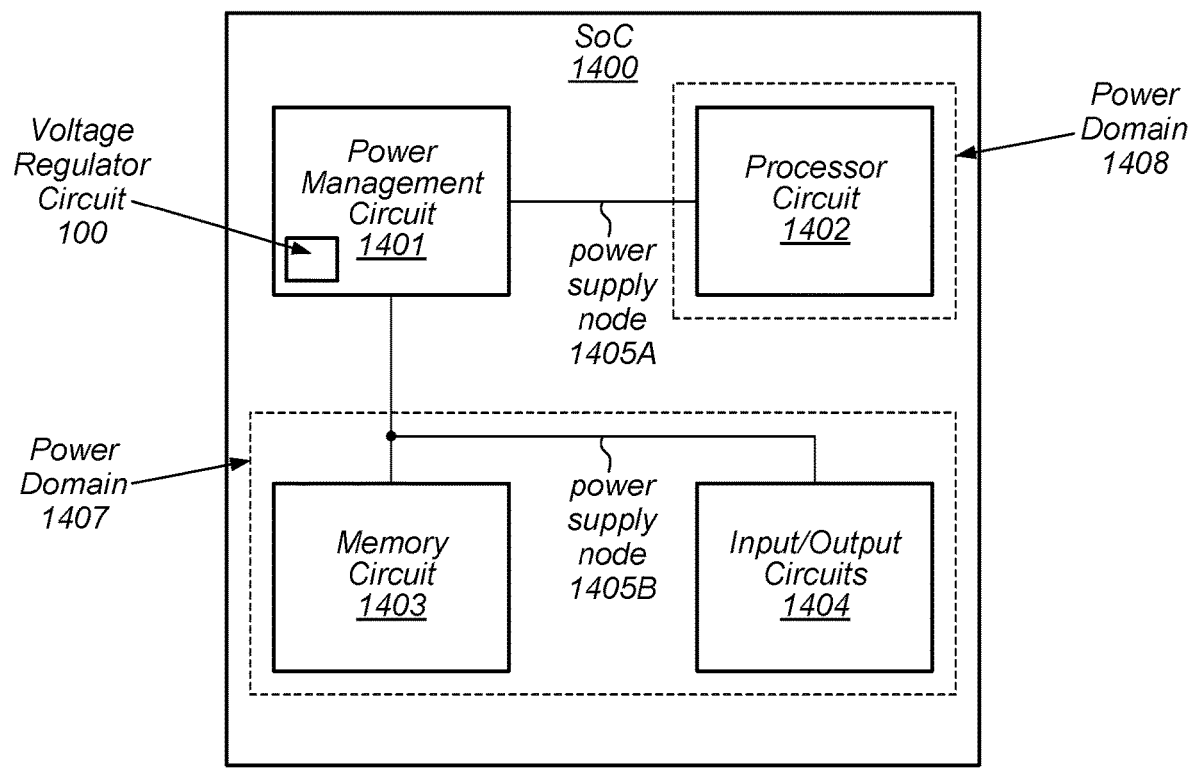
FIG. 14 illustrates a block diagram of a system-on-a-chip.

A block diagram of a system-on-a-chip (SoC) is illustrated in FIG. 14. In the illustrated embodiment, the SoC 1400 includes power management unit 1401, processor circuit 1402, memory circuit 1403, and input/output circuits 1404, each of which is coupled to power supply signal 1405. In various embodiments, SoC 1400 may be a system-on-a-chip (SoC) and/or be configured for use in a desktop computer, server, or in a mobile computing application such as, e.g., a tablet, laptop computer, or wearable computing device.

Power management unit 1401 includes power converter circuit 100, which is configured to generate respective regulated voltage levels on power supply node 1405A and 1405B. Power supply node 1405A provides power to circuits in power domain 1408 including processor circuit 1402, while power supply node 1405B provides power to circuit included in power domain 1407 memory circuit 1403, and input/output circuits 1404. Although power management unit 1401 is depicted as including a single voltage regulator circuit, in other embodiments, any suitable number of voltage regulator circuits may be included in power management unit 1401, each configured to generate a regulated voltage level on a respective one of multiple power supply nodes.

Processor circuit 1402 may, in various embodiments, be representative of a general-purpose processor that performs computational operations. For example, processor circuit 1402 may be a central processing unit (CPU), a graphics processing unit (GPU), a microcontroller, or the like, and may be implemented as an application-specific integrated circuit (ASIC), a field-programmable gate array (FPGA), etc. In some embodiments, processor circuit 1402 may interface to memory circuit 1403 and input/output circuits 1404 via a communication bus.

Memory circuit 1403 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that although a single memory circuit is illustrated in FIG. 14, in other embodiments, any suitable number of memory circuits may be employed.

Input/output circuits 1404 may be configured to coordinate data transfer between SoC 1400 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1404 may be configured to implement a version of Universal Serial Bus (USB) protocol or IEEE 1394 (Firewire®) protocol.

Input/output circuits 1404 may also be configured to coordinate data transfer between SoC 1400 and one or more devices (e.g., other computing systems or integrated circuits) coupled to SoC 1400 via a network. In one embodiment, input/output circuits 1404 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1404 may be configured to implement multiple discrete network interface ports.

Figure 15:
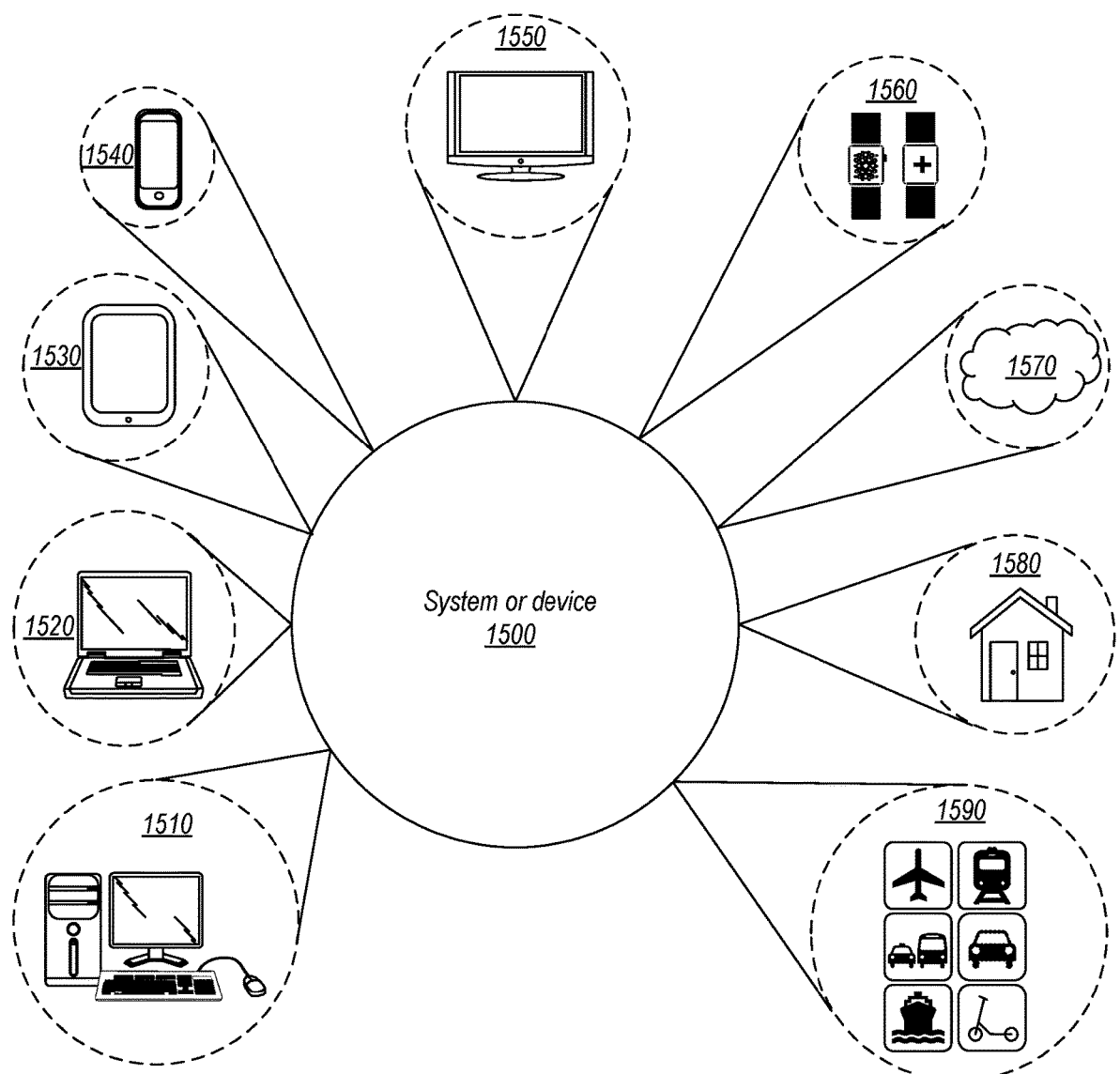
FIG. 15 illustrates a block diagram of a computer system.

Turning now to FIG. 15, various types of systems that may include any of the circuits, devices, or system discussed above are illustrated. System or device 1500, which may incorporate or otherwise utilize one or more of the techniques described herein, may be utilized in a wide range of areas. For example, system or device 1500 may be utilized as part of the hardware of systems such as a desktop computer 1510, laptop computer 1520, tablet computer 1530, cellular or mobile phone 1540, or television 1550 (or set-top box coupled to a television).

Similarly, disclosed elements may be utilized in a wearable device 1560, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1500 may also be used in various other contexts. For example, system or device 1500 may be utilized in the context of a server computer system, such as a dedicated server, or on shared hardware that implements a cloud-based service 1570. Still further, system or device 1500 may be implemented in a wide range of specialized everyday devices, including devices 1580 commonly found in the home such as refrigerators, thermostats, security cameras, etc. The interconnection of such devices is often referred to as the "Internet of Things" (IoT). Elements may also be implemented in various modes of transportation. For example, system or device 1500 could be employed in the control systems, guidance systems, entertainment systems, etc. of various types of vehicles 1590.

The applications illustrated in FIG. 15 are merely exemplary and are not intended to limit the potential future applications of disclosed systems or devices. Other example applications include, without limitation: portable gaming devices, music players, data storage devices, unmanned aerial vehicles, etc.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such as "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
   a switched-capacitor circuit coupled to a regulated power supply node, wherein the switched-capacitor circuit includes a plurality of capacitors and a plurality of switches, and wherein the switched-capacitor circuit is configured to:
      in response to an activation of a pre-charge mode, couple the plurality of capacitors between the regulated power supply node and a ground supply node; and generate a particular voltage level on the regulated power supply node using a reference voltage;
a first bypass device coupled between an input power supply node and the regulated power supply node, wherein the first bypass device is configured to source a bypass current to the regulated power supply node; and
a control circuit configured to:
in response to receiving a change request:
transition the reference voltage between a first value and a second value according to a programmable ramp control signal; and
activate the first bypass device.

2. The apparatus of claim 1, wherein the control circuit is further configured to:
in response to receiving the change request, change an operation mode of the switched-capacitor circuit based on a new value of the reference voltage; and
in response to receiving a startup request, activate the pre-charge mode and the first bypass device.

3. The apparatus of claim 1, further comprising a second bypass device coupled between the regulated power supply node and a ground supply, and wherein the control circuit is further configured, in response to a decrease in the reference voltage, to activate the second bypass device.

4. The apparatus of claim 3, wherein in response to receiving a shutdown request, the control circuit is further configured to:
activate the second bypass device; and
change an operation mode of the switched-capacitor circuit to a lowest output operation mode.

5. The apparatus of claim 1, wherein the control circuit is further configured to change an operation mode of the switched-capacitor circuit based on the voltage level of the regulated power supply node.

6. The apparatus of claim 5, wherein to change the operation mode of the switched-capacitor circuit includes changing a conversion ratio of the switched-capacitor circuit.

7. A method, comprising:
in response to receiving a startup request by a power converter circuit that is coupled to a regulated power supply node:
sourcing a bypass current to the regulated power supply node; and
pre-charging a switched-capacitor circuit included in the power converter circuit, wherein the switched-capacitor circuit is coupled to the regulated power supply node and includes a plurality of capacitors and a plurality of switches;
in response to determining that a voltage level of the regulated power supply node is greater than a pre-charge value:
halting the sourcing of the bypass current; and
activating the switched-capacitor circuit to regulate the voltage level on the regulated power supply node using a reference voltage; and
in response to receiving a change request, transitioning the reference voltage from a first value to a second value according to a programmable ramp control signal, and sourcing the bypass current to the regulated power supply node.

8. The method of claim 7, wherein sourcing the bypass current includes activating a bypass device included in the power converter circuit, wherein the bypass device is coupled between an input power supply and the regulated power supply node.

9. The method of claim 7, further comprising, in response to an increase in the reference voltage, changing an operation mode of the switched-capacitor circuit based on a new level of the reference voltage.

10. The method of claim 7, further comprising, in response to a decrease in the reference voltage, transitioning through multiple operation modes of the switched-capacitor circuit from a current operation mode to a target operation mode.

11. The method of claim 10, further comprising coupling charge from the regulated power supply node to an input power supply node during a reduction of the reference voltage.

12. The method of claim 7, further comprising, in response to receiving a shutdown request:
sinking a discharge current from the regulated power supply node; and
changing an operation mode of the switched-capacitor circuit to a lowest output operation mode.

13. The method of claim 12, wherein sinking the discharge current from the regulated power supply node includes activating a bypass device coupled between the regulated power supply node and a ground supply node.

14. An apparatus, comprising:
a first integrated circuit including a buck converter circuit coupled to a first power supply node via an inductor, wherein the buck converter circuit is configured, in response to a startup request, to generate an initial voltage level on the first power supply node;
a power delivery network configured to couple the first power supply node to a second power supply node;
a second integrated circuit including a switched-capacitor regulator circuit that includes a plurality of capacitors, a plurality of switches, and a bypass device coupled between the second power supply node and a third power supply node, wherein the switched-capacitor regulator circuit is configured to:
generate a particular voltage level on a third power supply node using a voltage level of the second power supply node; and
in response to receiving a change request, transition a reference voltage between a first value and a second value according to a programmable ramp control signal, and activate the bypass device to source a bypass current to the third power supply node; and
wherein the buck converter circuit is further configured, in response to an activation of the switched-capacitor regulator circuit, to increase a voltage level of the first power supply node from the initial voltage level to a final voltage level greater than the initial voltage level.

15. The apparatus of claim 14, wherein the switched-capacitor regulator circuit is further configured to increase a voltage level of the third power supply node in response to an increase in the voltage level of the first power supply node.

16. The apparatus of claim 14, wherein the second integrated circuit further includes a plurality of passive devices coupled to the third power supply node.

17. The apparatus of claim 14, wherein the buck converter circuit is further configured, in response to receiving a shutdown request, to reduce the voltage level of the first power supply node from a current value to a different value lower than the current value.

18. The apparatus of claim 17, wherein the switched-capacitor regulator circuit is further configured to reduce a voltage level of the third power supply node in response to a reduction in the voltage level of the first power supply node.

19. The apparatus of claim 18, wherein the switched-capacitor regulator circuit is further configured to de-activate, in response to a determination that the voltage level of the third power supply node has reached a shutdown value, and wherein the buck converter circuit is further configured, in response to a de-activation of the switched-capacitor regulator circuit, to de-activate.

\* \* \* \* \*